US010283618B1

(12) United States Patent
Chang et al.

(10) Patent No.: US 10,283,618 B1
(45) Date of Patent: May 7, 2019

(54) SEMICONDUCTOR DEVICE AND MANUFACTURING METHOD THEREOF (71) Applicant: UNITED MICROELECTRONICS CORP., Hsin-Chu (TW)

(72) Inventors: Hao-Hsuan Chang, Kaohsiung (TW); Yao-Hsien Chung, Kaohsiung (TW); Fu-Yu Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/838,243

(22) Filed: Dec. 11, 2017

(30) Foreign Application Priority Data

Nov. 7, 2017 (CN) .......................... 2017 1 1082658

(51) Int. Cl.
| H01L 21/338 | (2006.01) |
| H01L 21/8238 | (2006.01) |
| H01L 27/092 | (2006.01) |
| H01L 29/49 | (2006.01) |
| H01L 21/8234 | (2006.01) |
| H01L 29/165 | (2006.01) |
| H01L 29/66 | (2006.01) |
| H01L 27/088 | (2006.01) |

(52) U.S. Cl.
CPC ............. *H01L 29/66545* (2013.01); *H01L 21/823431* (2013.01); *H01L 21/823462* (2013.01); *H01L 21/823468* (2013.01); *H01L 27/0886* (2013.01); *H01L 29/6656* (2013.01)

(58) Field of Classification Search
CPC ....... H01L 21/823842; H01L 21/28088; H01L 29/66545; H01L 29/4966; H01L 29/4975; H01L 29/517
See application file for complete search history.

(56) References Cited

U.S. PATENT DOCUMENTS

| 2007/0290250 | A1  | 12/2007 | Clark   |              |
| 2012/0315749 | A1* | 12/2012 | Hempel  | H01L 21/28176 438/591 |
| 2013/0037890 | A1  | 2/2013  | Tseng   |              |
| 2013/0277854 | A1* | 10/2013 | Wong    | H01L 21/76898 257/774 |

(Continued)

OTHER PUBLICATIONS

Lai, Title of Invention: Semiconductor Structure and Fabrication Method Thereof, U.S. Appl. No. 13/244,948, filed Sep. 26, 2011.

*Primary Examiner* — Brian Turner
(74) *Attorney, Agent, or Firm* — Winston Hsu (57) ABSTRACT A manufacturing method of a semiconductor device includes the following steps. A first stacked structure and a second stacked structure are formed on a core region and an input/output (I/O) region of a semiconductor substrate respectively. The first stacked structure includes a first patterned oxide layer, a first patterned nitride layer, and a first dummy gate. The second stacked structure includes a second patterned oxide layer, a second patterned nitride layer, and a second dummy gate. The first dummy gate and the second dummy gate are removed for forming a first recess above the core region and a second recess above the I/O region. A first gate structure is formed in the first recess and a second gate structure is formed in the second recess. The first patterned nitride layer is removed before the step of forming the first gate structure in the first recess.

12 Claims, 8 Drawing Sheets (56) References Cited

U.S. PATENT DOCUMENTS

| | | | | |
|---|---|---|---|---|
| 2014/0001540 A1* | 1/2014 | Wang | ............... | H01L 29/66666 257/329 |
| 2015/0311308 A1* | 10/2015 | Siddiqui | .............. | H01L 29/513 257/637 |
| 2016/0163859 A1* | 6/2016 | Wu | .................... | H01L 29/7848 257/192 |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a core region and an input/output region and a manufacturing method thereof.

2. Description of the Prior Art

In the continuously improved semiconductor integrated circuit technology, the sizes of the semiconductor devices become smaller for increasing the integrity of the integrated circuit. In the scaling down process, the thickness control of layers in the semiconductor device becomes more and more critical. For improving the metal-oxide-semiconductor field effect transistor (MOSFET) device performance as feature sizes continue to decrease, the traditional gate oxide and polysilicon gate electrode are replaced by a high dielectric constant (high-k) gate dielectric and a metal gate electrode. In high-k gate stacks, the interfacial layer (IL) underlying the high-k dielectric layer plays a critical role in the performance of the MOSFET.

In an integrated circuit, different circuit modules and/or transistors and other devices in the same chip may operate indifferent voltage regimes. For instance, in an integrated switching-mode power supply, which may include a power transistor and a control circuit for switching the power transistor ON and OFF to convert a supply voltage into a desired output voltage, the power transistor may have an operating voltage much higher than an operating voltage of transistors constituting the control circuit. In order to have an area-efficient high voltage device with low voltage control devices fabricated on a same die, gate insulation layers with different thicknesses are required. However, the manufacturing process may become complicated and/or negative effects may be generated by the approaches of forming gate dielectric layers with different thicknesses, and the manufacturing yield may be influenced accordingly.

SUMMARY OF THE INVENTION

A semiconductor device and a manufacturing method are provided in the present invention. Stacked structures including a patterned oxide layer and a patterned nitride layer are formed on a core region and an input/output (I/O) region, and the patterned nitride layer on the core region is removed after a step of removing dummy gates and before a step of forming gate structures for forming a thinner dielectric layer on the core region. By the manufacturing method of the present invention, it is not necessary to remove the oxide dielectric layer on the core region, and influence of an oxide dielectric layer etching process on other oxide portion may be avoided. The manufacturing yield may be enhanced and the electric performance of the semiconductor device may be improved accordingly.

According to an embodiment of the present invention, a manufacturing method of a semiconductor device is provided. The manufacturing method includes the following steps. A semiconductor substrate is provided first. The semiconductor substrate includes a core region and an input/output (I/O) region defined thereon. A first stacked structure is formed on the core region. A second stacked structure is formed on the I/O region. The first stacked structure includes a first patterned oxide layer, a first patterned nitride layer, and a first dummy gate. The first patterned nitride layer is formed on the first patterned oxide layer. The first dummy gate is formed on the first patterned nitride layer. The second stacked structure includes a second patterned oxide layer, a second patterned nitride layer, and a second dummy gate. The second patterned nitride layer is formed on the second patterned oxide layer. The second dummy gate is formed on the second patterned nitride layer. The first dummy gate and the second dummy gate are removed for forming a first recess above the core region and a second recess above the I/O region. A first gate structure is formed in the first recess, and a second gate structure is formed in the second recess. The first patterned nitride layer is removed before the step of forming the first gate structure in the first recess.

According to another embodiment of the present invention, a semiconductor device is provided. The semiconductor device includes a semiconductor substrate, a first gate structure, a second gate structure, an oxide dielectric layer, and a nitride dielectric layer. The semiconductor substrate includes a core region and an input/output (I/O) region defined thereon. The first gate structure is disposed on the core region. The second gate structure is disposed on the I/O region. The oxide dielectric layer is party disposed between the first gate structure and the semiconductor substrate and partly disposed between the second gate structure and the semiconductor substrate. The nitride dielectric layer is disposed between the second gate structure and the oxide dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
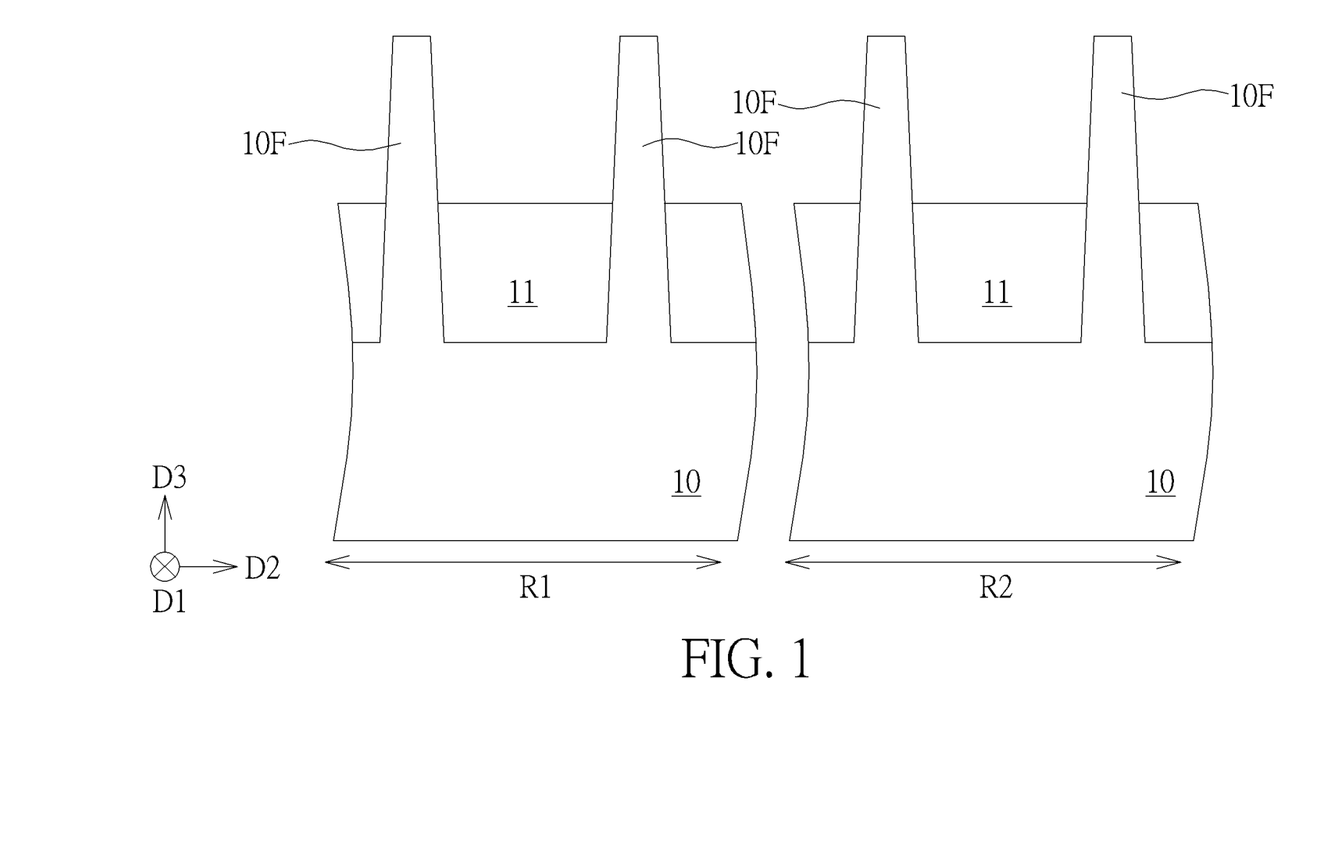
FIG. 1 is a schematic drawing illustrating a manufacturing method of a semiconductor device according to an embodiment of the present invention.

Please refer to FIGS. 1-8. FIGS. 1-8 are schematic drawings illustrating a manufacturing method of a semiconductor device according to an embodiment of the present invention. The manufacturing method in this embodiment may include the following steps. As shown in FIG. 1, a semiconductor substrate 10 is provided first. The semiconductor substrate 10 includes a core region R1 and an input/output (I/O) region R2 defined thereon. The core region R1 may be used to form semiconductor units having relatively lower operation voltage, and the I/O region R2 may be used to form semiconductor units having relatively higher operation voltage, but not limited thereto. The semiconductor substrate 10 may include a silicon substrate, an epitaxial silicon substrate, a silicon germanium substrate, a silicon carbide substrate, or a silicon-on-insulator (SOI) substrate, but not limited thereto. In some embodiments, the semiconductor substrate 10 may include a plurality of fin structures 10F located in the core region R1 and the I/O region R2 respectively, and each of the fin structures 10F may include a fin structure made of a semiconductor material. Each of the fin structures 10F may extend in a first direction D1, and the fin structures 10F may be repeatedly arranged in the second direction D2. The first direction D1 and the second direction D2 may be substantially orthogonal to each other, but not limited thereto. The fin structures 10F may be formed by performing a patterning process (such as a multiple exposure process) to the semiconductor substrate 10, and the fin structures 10F may be separated from one another by a shallow trench isolation (STI) 11. The shallow trench isolation 11 may include a single layer or multiple layers of insulation materials, such as an oxide insulation material, but not limited thereto.

Figure 2:
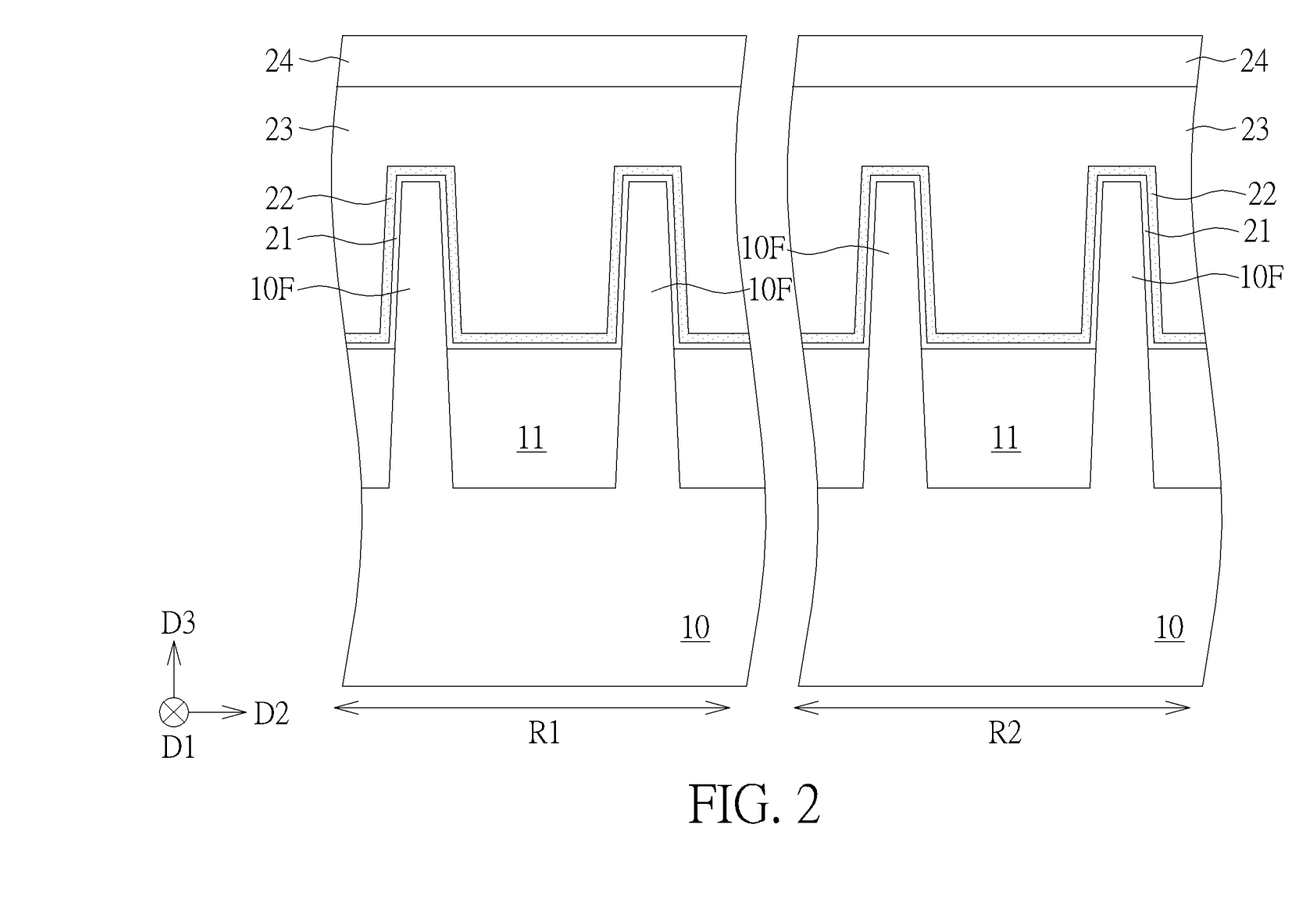
FIG. 2 is a schematic drawing in a step subsequent to FIG. 1.
Figure 3:
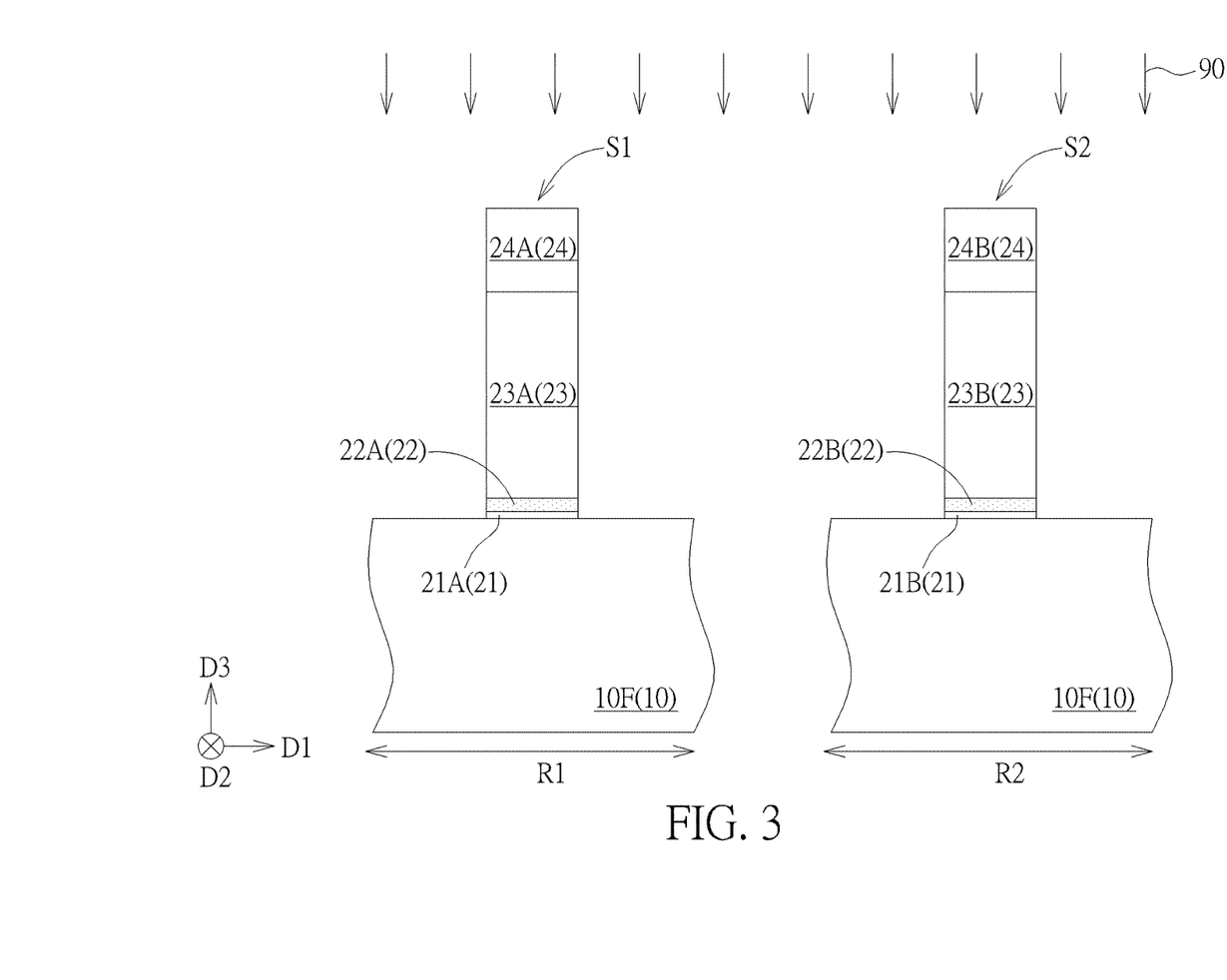
FIG. 3 is a schematic drawing in a step subsequent to FIG. 2.

As shown in FIG. 2 and FIG. 3, a first stacked structure S1 is formed on the core region R1, and a second stacked structure S2 is formed on the I/O region R2. The first stacked structure S1 may include a first patterned oxide layer 21A, a first patterned nitride layer 22A, and a first dummy gate 23A. The first patterned nitride layer 22A may be formed on the first patterned oxide layer 21A in a thickness direction of the semiconductor substrate 10 (such as a third direction D3 shown in FIG. 3), and the first dummy gate 23A may be formed on the first patterned nitride layer 22A in the third direction D3. The second stacked structure S2 may include a second patterned oxide layer 21B, a second patterned nitride layer 22B, and a second dummy gate 23B. The second patterned nitride layer 22B may be formed on the second patterned oxide layer 21B in the third direction D3, and the second dummy gate 23B may be formed on the second patterned nitride layer 22B in the third direction D3. In some embodiments, the first patterned oxide layer 21A and the second patterned oxide layer 21B may be formed by the same process patterning an oxide dielectric layer 21, and the material of the first patterned oxide layer 21A may be identical to the material of the second patterned oxide layer 21B accordingly, but not limited thereto. In addition, the first patterned nitride layer 22A and the second patterned nitride layer 22B may be formed by the same process patterning a nitride dielectric layer 22, and the material of the first patterned nitride layer 22A may be identical to the material of the second patterned nitride layer 22B accordingly, but not limited thereto.

For example, as shown in FIG. 2 and FIG. 3, the oxide dielectric layer 21, the nitride dielectric layer 22, a dummy gate material layer 23, and a cap layer 24 may be sequentially formed after the step of forming the shallow trench isolation 11. The oxide dielectric layer 21, the nitride dielectric layer 22, the dummy gate material layer 23, and the cap layer 24 may be formed on the core region R1 and the I/O region R2. Subsequently, a patterning process 90 is performed, and the oxide dielectric layer 21, the nitride dielectric layer 22, the dummy gate material layer 23, and the cap layer 24 are patterned by the patterning process 90 to become the first stacked structure S1 and the second stacked structure S2. Therefore, the first dummy gate 23A and the second dummy gate 23B may be formed by the same process patterning the dummy gate material layer 23, and the material of the first dummy gate 23A may be identical to the material of the second dummy gate 23B, but not limited thereto. Additionally, in some embodiments, the first stacked structure S1 may further include a first patterned cap layer 24A formed on the first dummy gate 23A, and the second stacked structure S2 may further include a second patterned cap layer 24B formed on the second dummy gate 23B. The first patterned cap layer 24A and the second patterned cap layer 24B may be formed by the same process patterning the cap layer 24, and the material of the first patterned cap layer 24A may be identical to the material of the second patterned cap layer 24B, but not limited thereto In some embodiments, the oxide dielectric layer 21 may be formed by an oxidation treatment performed to the semiconductor substrate 10, such as a part of the fin structure 10F which is not covered by the shallow trench isolation 11, and the oxide dielectric layer 21 may include silicon oxide or other suitable oxide dielectric materials. The oxidation treatment mentioned above may include in-situ steam generation (ISSG) oxidation treatment or other appropriate oxidation treatments. Additionally, the nitride dielectric layer 22 may include silicon nitride or other suitable nitride dielectric materials. The method of forming the nitride dielectric layer 22 may include a chemical vapor deposition (CVD) process, such as an atomic layer deposition (ALD), or other suitable thin film processes. The material of the dummy gate material layer 23 may include amorphous silicon or other materials having higher etching selectivity to the nitride dielectric layer 22 for avoiding damaging the nitride dielectric layer 22 in the process of removing the first dummy gate 23A and the second dummy gate 23B subsequently, and the material of the cap layer 24 may include silicon nitride, silicon oxynitride, or other appropriate insulation materials, but not limited thereto.

It is worth noting that the material composition and the manufacturing method of the first stacked structure S1 and the second stacked structure S2 in the present invention are not limited to the condition described above. When the first stacked structure S1 and the second stacked structure S2 are formed by the manufacturing method described above, the thickness of the first patterned oxide layer 21A may be substantially equal to the thickness of the second patterned oxide layer 21B, and the thickness of the first patterned nitride layer 22A may be substantially equal to the thickness of the second patterned nitride layer 22B. In the subsequent processes, the first patterned nitride layer 22A on the core region R1 will be removed, and only the first patterned oxide layer 21A is used as an interfacial layer (IL) on the core region R1. The interfacial layer on the I/O region R2 is composed of the second patterned nitride layer 22B and the second patterned oxide layer 21B for high voltage semiconductor units formed on the I/O region R2. Therefore, the thickness of the nitride dielectric layer 22 may be modified according to the requirements of the high voltage semiconductor units formed on the I/O region R2, and the nitride dielectric layer is thicker than the oxide dielectric layer 21 generally, but not limited thereto.

Figure 4:
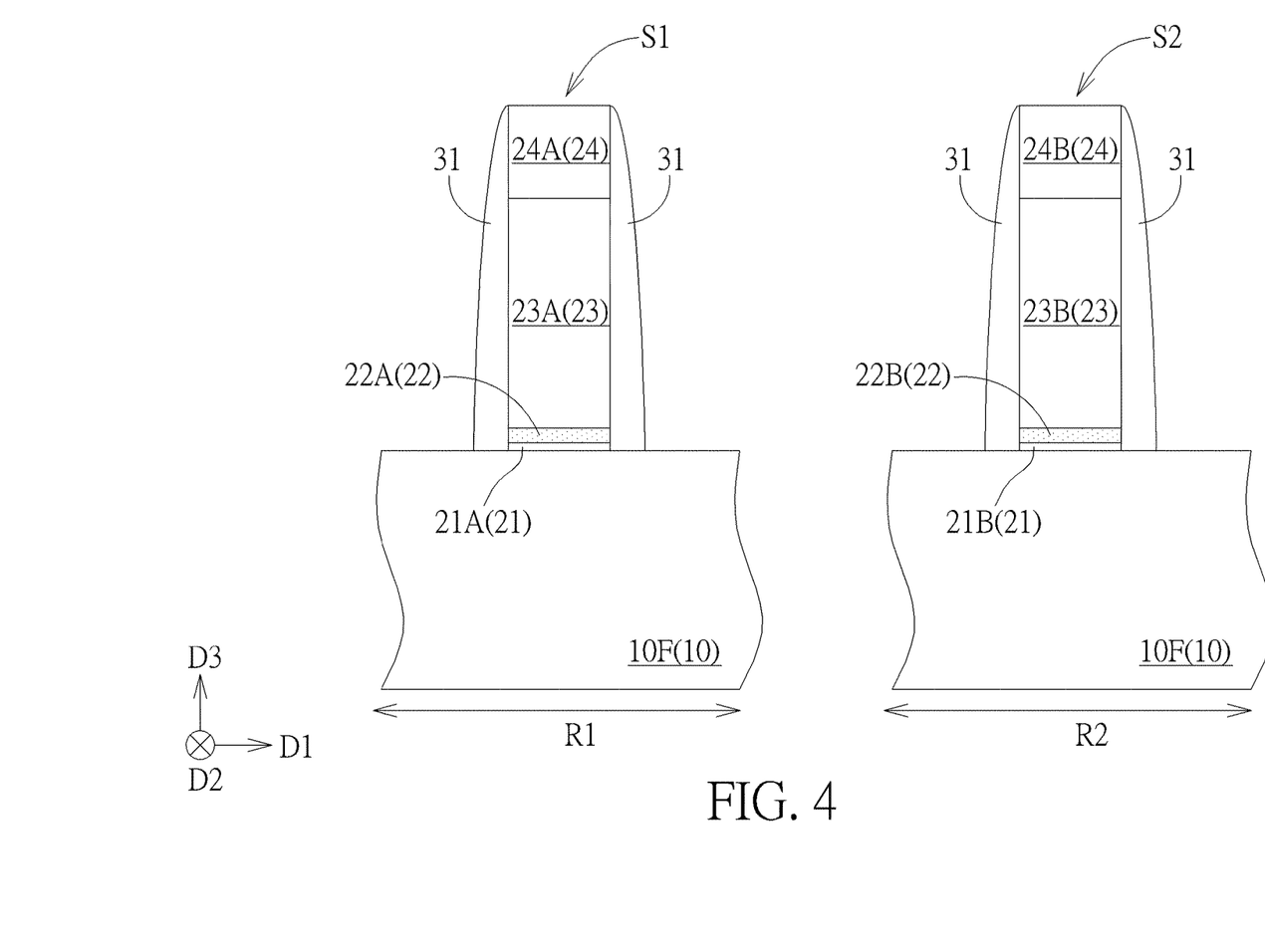
FIG. 4 is a schematic drawing in a step subsequent to FIG. 3.
Figure 5:
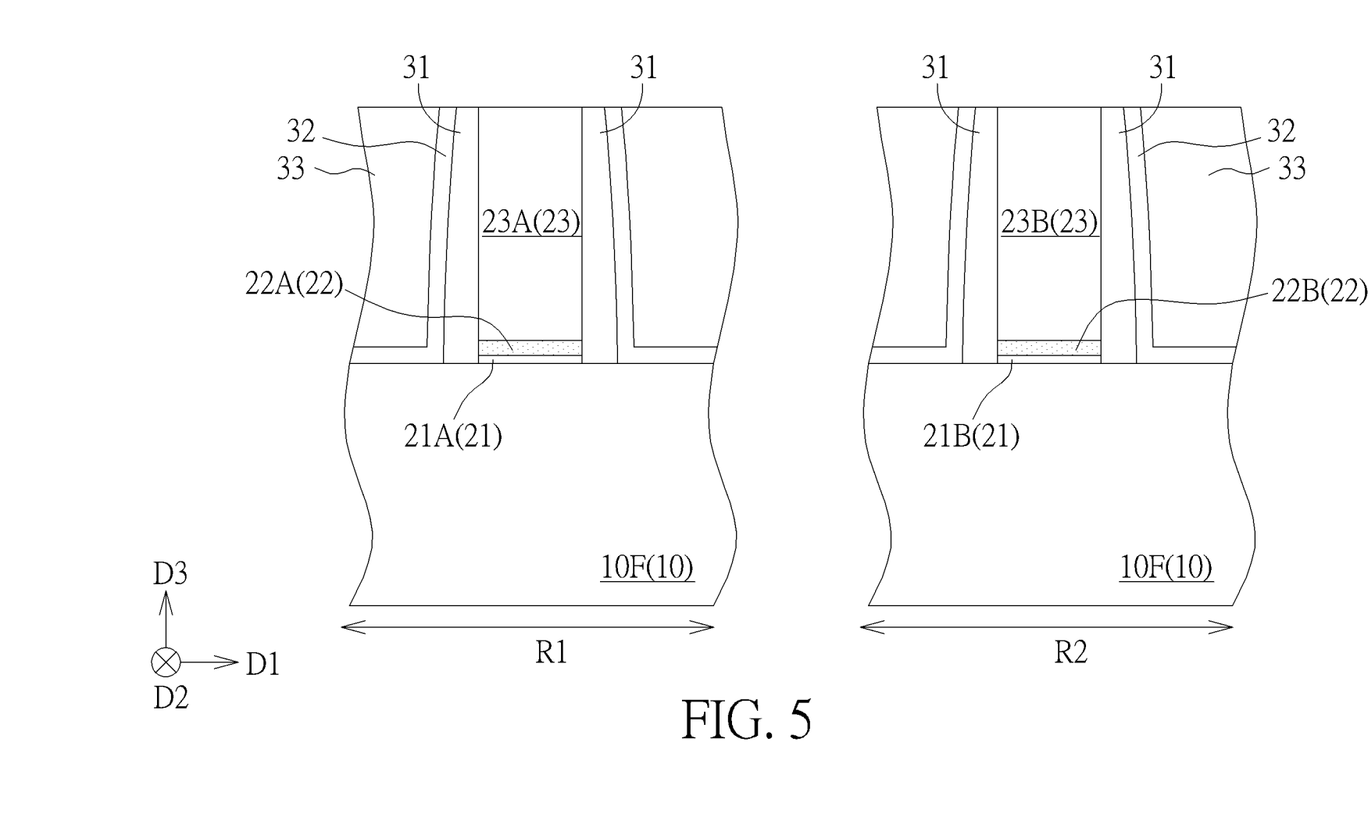
FIG. 5 is a schematic drawing in a step subsequent to FIG. 4.
Figure 6:
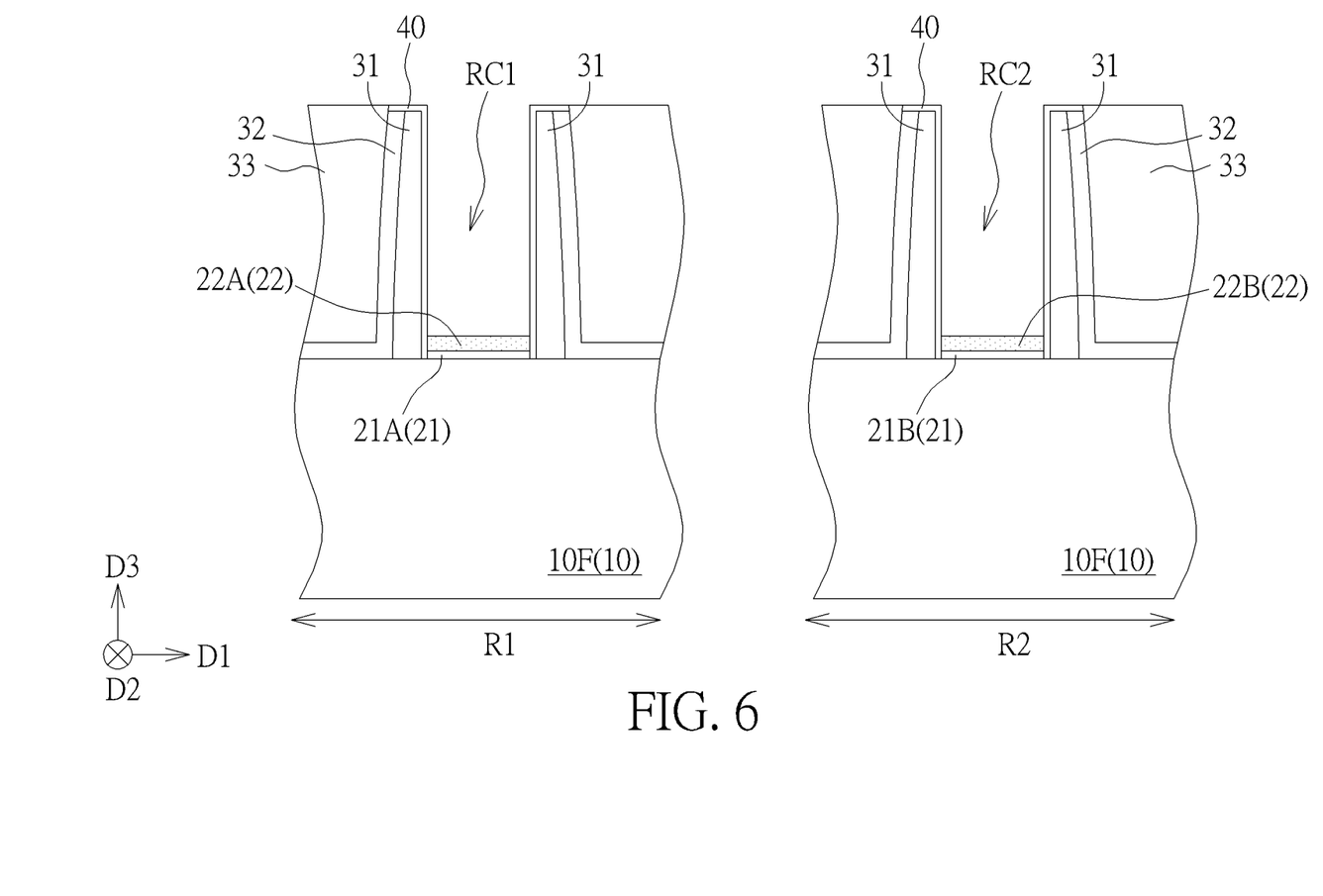
FIG. 6 is a schematic drawing in a step subsequent to FIG. 5.

As shown in FIGS. 4-6, the first dummy gate 23A and the second dummy gate 23B are removed for forming a first recess RC1 above the core region R1 and a second recess RC2 above the I/O region R2. Specifically, in some embodiments, a spacer 31 may be formed on a sidewall of the first stacked structure S1 and a sidewall of the second stacked structure S2 before the step of removing the first dummy gate 23A and the second dummy gate 23B, and the first recess RC1 and the second recess RC2 may be surrounded by the spacer 31. The spacer 31 may include a single layer structure or a multiple layer structure, and the material of the spacer 31 may include silicon oxycarbonitride (SiOCN), silicon nitride, or other suitable insulation materials. As shown in FIG. 4 and FIG. 5, a contact etching stop layer 32 and an interlayer dielectric 33 may be formed covering the first stacked structure S1 and the second stacked structure S2 before the step of removing the first dummy gate 23A and the second dummy gate 23B, and a chemical mechanical polish (CMP) process may be used to remove the first patterned cap layer 24A, the second patterned cap layer 24B, apart of the contact etching stop layer 32, and a part of the interlayer dielectric 33 for exposing the first dummy gate 23A and the second dummy gate 23B. In some embodiments, the material of the contact etching stop layer 32 may include silicon nitride, and the material of the interlayer dielectric 33 may include silicon oxide, but not limited thereto. In some embodiments, doped regions (not shown) may be formed in the semiconductor substrate 10 at two opposite sides of the first dummy gate 23A and two opposite sides of the second dummy gate 23B before the step of forming the contact etching stop layer 32 and the interlayer dielectric 33, but not limited thereto. As shown in FIG. 5 and FIG. 6, the first dummy gate 23A and the second dummy gate 23B are removed for forming the first recess RC1 and the second recess RC2. It is worth noting that, in some embodiments, an oxidation layer 40 may be formed on a surface of the spacer 31 by the step of removing the first dummy gate 23A and the second dummy gate 23B, especially when the step of removing the first dummy gate 23A and the second dummy gate 23B includes a process having oxidation effect, such as a descum process, but not limited thereto. Accordingly, in some embodiments, the first recess RC1 and the second recess RC2 may be surrounded by the oxidation layer 40, the spacer 31, the contact etching stop layer 32, and the interlayer dielectric 33.

Figure 7:
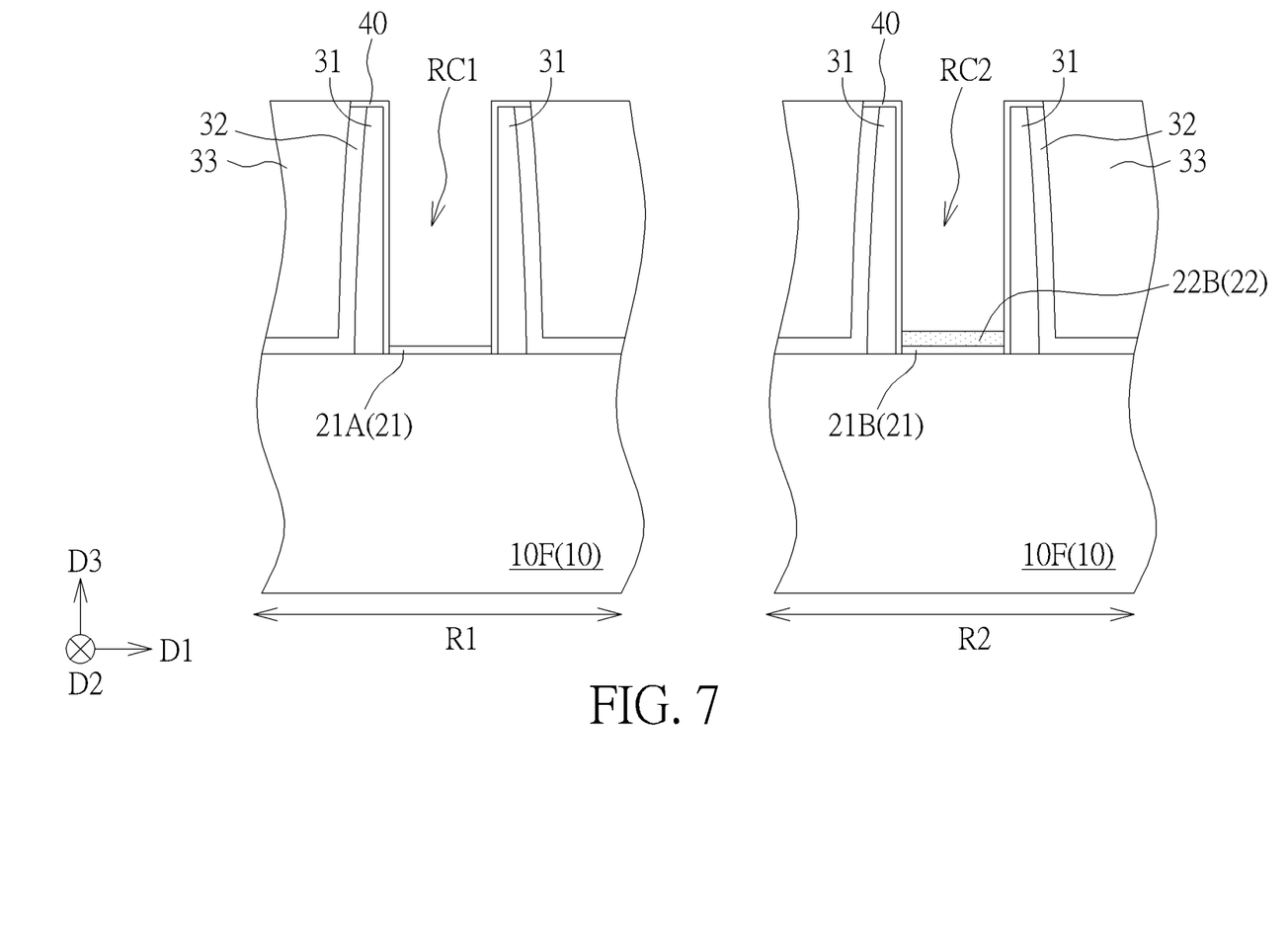
FIG. 7 is a schematic drawing in a step subsequent to FIG. 6.
Figure 8:
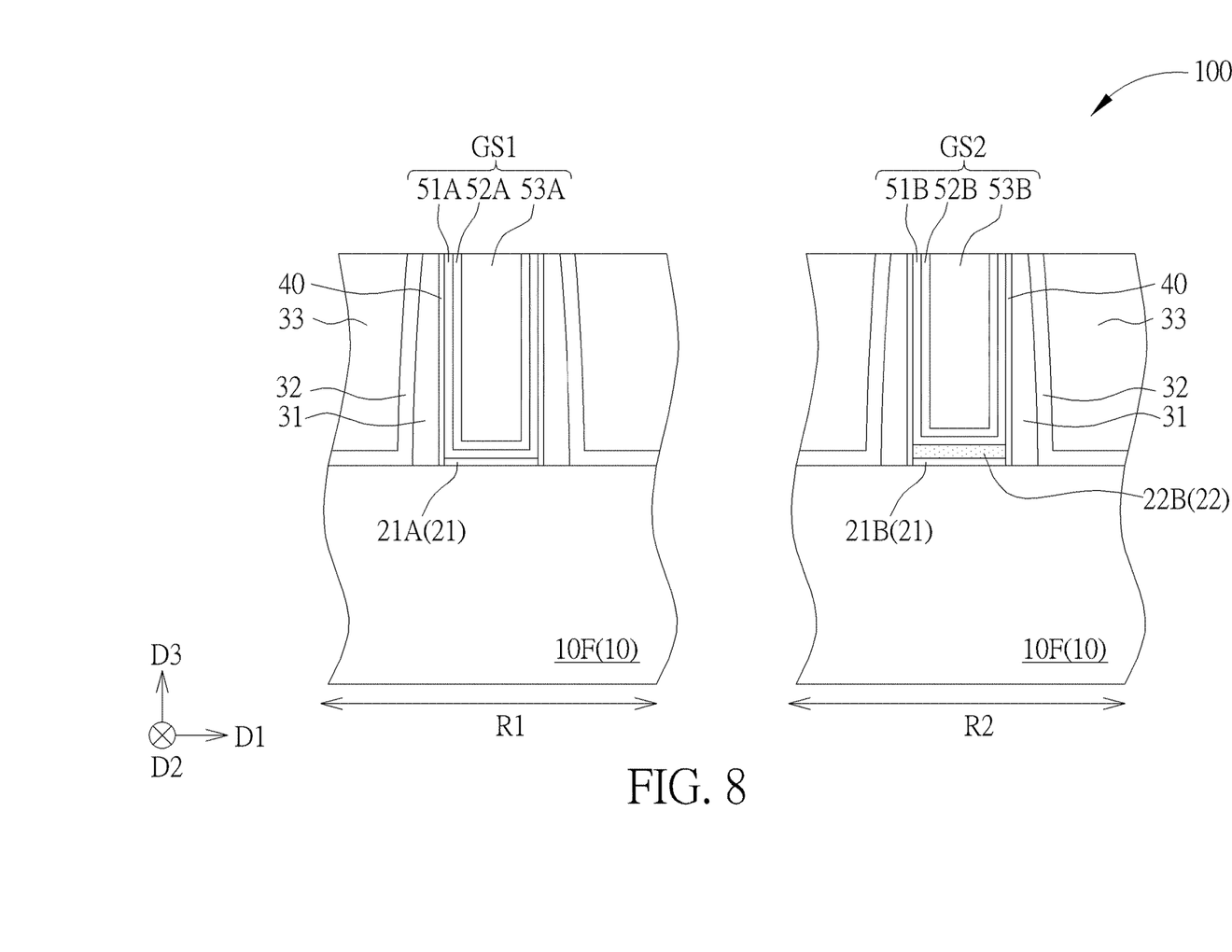
FIG. 8 is a schematic drawing in a step subsequent to FIG. 7.

As shown in FIGS. 6-8, a first gate structure GS1 is formed in the first recess RC1, and a second gate structure GS2 is formed in the second recess RC2. The first patterned nitride layer 22A is removed before the step of forming the first gate structure GS1 in the first recess RC1. As shown in FIG. 6 and FIG. 7, the oxidation layer 40 is formed before the step of removing the first patterned nitride layer 22A, and the second patterned nitride layer 22B on the I/O region R2 may be covered by a mask (such as a photoresist, not shown) in the step of removing the first patterned nitride layer 22A for avoiding being removed. A wet etching process or a dry etching process having higher etching selectivity may be used to remove the first patterned nitride layer 22A for avoiding etching oxide (such as the oxidation layer 40 and the interlayer dielectric 33), and that is beneficial to control the size of the first recess RC1 and the thickness of the interlayer dielectric 33. Comparatively, the oxidation layer 40 and the interlayer dielectric 33 will be damaged by a step of removing the first patterned oxide layer 21A when the first patterned oxide layer 21A has to be removed after the step of forming the first recess RC1 and the second recess RC2 for reforming the required oxide interfacial layer. The height of the interlayer dielectric 33 will be reduced and the width of the first gate structure subsequently formed in the first recess RC1 will be increased accordingly, and the manufacturing yield and the electrical performance will be affected.

As shown in FIG. 7 and FIG. 8, in some embodiments, required material layers may be sequentially formed in the first recess RC1, in the second recess RC2, and on the interlayer dielectric 33, and a planarization process such as a chemical mechanical polish process may be used to remove the material layers outside the first recess RC1 and the second recess RC2 for forming the first gate structure GS1 and the second gate structure GS2, but not limited thereto. In some embodiments, the material layers mentioned above may include a high dielectric constant (high-k) dielectric layer, a work function layer, a barrier layer, and a low resistivity material layer, but not limited thereto. For example, the first gate structure GS1 may include a first high-k dielectric layer 51A and a first metal gate 53A, and the second gate structure GS2 may include a second high-k dielectric layer 51B and a second metal gate 53B. The first metal gate 53A may be formed on the first high-k dielectric layer 51A, and the second metal gate 53B may be formed on the second high-k dielectric layer 51B. In some embodiments, the first high-k dielectric layer 51A and the second high-k dielectric layer 51B may be conformally formed on the surface of the first recess RC1 and on the surface of the second recess RC2 respectively. Therefore, the first high-k dielectric layer 51A may include a U-shaped structure surrounding the first metal gate 53A, and the second high-k dielectric layer 51B may also include a U-shaped structure surrounding the second metal gate 53B. Additionally, other material layers such as work function layers and/or barrier layers may be formed between the first high-k dielectric layer 51A and the first metal gate 53A and formed between the second high-k dielectric layer 51B and the second metal gate 53B according to other considerations, but not limited thereto. For instance, the first gate structure GS1 may further include a first work function layer 52A formed between the first high-k dielectric layer 51A and the first metal gate 53A, and the second gate structure GS2 may further include a second work function layer 52B formed between the second high-k dielectric layer 51B and the second metal gate 53B.

In some embodiments, the material of the first high-k dielectric layer 51A and the material of the second high-k dielectric layer 51B may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials. The material of the first work function layer 52A and the material of the second work function layer 52B may include tantalum nitride (TaN), titanium nitride (TiN), titanium carbide (TiC), titanium aluminide (TiAl), titanium aluminum carbide (TiAlC), or other suitable N type work function materials and/or P type work function materials. The first metal gate 53A and the second metal gate 53B may include a low resistivity metal, such as aluminum (Al), tungsten (W), copper (Cu), titanium aluminide, or other appropriate low resistivity metals. In some embodiments, the first high-k dielectric layer 51A and the second high-k dielectric layer 51B may be formed by the same process and the same material layer, the first metal gate 53A and the second metal gate 53B may be formed by the same process and the same material layer, and the material of the first work function layer 52A may be identical to or different from the material of the second work function layer 52B according to other considerations, but not limited thereto. Because the first patterned nitride layer on the core region R1 is removed before the step of forming the first gate structure GS1 and the second patterned nitride layer 22B is not removed, the first patterned oxide layer 21A on the core region R1 may directly contact the first high-k dielectric layer 51A of the first gate structure GS1, and the second patterned nitride layer 22B may be located between the second high-k dielectric layer 51B of the second gate structure GS2 and the second patterned oxide layer 21B. A semiconductor device 100 shown in FIG. 8 may be formed by the manufacturing method described above.

As shown in FIG. 8, the semiconductor device 100 may include the semiconductor substrate 10, the first gate structure GS1, the second gate structure GS2, the oxide dielectric layer 21, and the nitride dielectric layer 22. The semiconductor substrate 10 includes the core region R1 and the input/output (I/O) region R2 defined thereon. The first gate structure GS1 is disposed on the core region R1. The second gate structure GS2 is disposed on the I/O region R2. The oxide dielectric layer 21 is party disposed between the first gate structure GS1 and the semiconductor substrate 10 in the third direction D3 and partly disposed between the second gate structure GS2 and the semiconductor substrate 10 in the third direction D3. The nitride dielectric layer 22 is disposed between the second gate structure GS2 and the oxide dielectric layer 21. In other words, the interfacial layer corresponding to the first gate structure GS1 on the core region R1 may be composed of the oxide dielectric layer 21 only, and the interfacial layer corresponding to the second gate structure GS2 on the I/O region R2 may be composed of the oxide dielectric layer 21 and the nitride dielectric layer 22. Accordingly, the operation voltage of the transistor formed by the second gate structure GS2 may be higher than the operation voltage of the transistor formed by the first gate structure GS1.

In addition, the oxide dielectric layer 21 disposed between the first gate structure GS1 and the semiconductor substrate 10 may be regarded as the first patterned oxide layer 21A, and the oxide dielectric layer 21 disposed between the second gate structure GS2 and the semiconductor substrate 10 may be regarded as the second patterned oxide layer 21B. Accordingly, the material of the first patterned oxide layer 21A on the core region R1 may be identical to the material of the second patterned oxide layer 21B on the I/O region R2, and the thickness of the first patterned oxide layer 21A on the core region R1 may be equal to the thickness of the second patterned oxide layer 21B on the I/O region R2. The first patterned oxide layer 21A does not have to be removed before the step of forming the first gate structure GS1 and the second gate structure GS2 for reforming a required interfacial layer because the first patterned oxide layer 21A corresponding to the first gate structure GS1 on the core region R1 and the second patterned oxide layer 21B corresponding to the second gate structure GS2 on the I/O region R2 may be formed by the same process, and the interfacial layer corresponding to the second gate structure GS2 may be composed of the second patterned oxide layer 21B and the second patterned nitride layer 22B disposed on the second patterned oxide layer 21B. The damage to the oxidation layer 40 and the interlayer dielectric 33 during the process of removing the first patterned oxide layer 21A may be avoided accordingly, and the purposes of enhancing manufacturing yield and improving the electrical performance may be achieved.

In some embodiments, the first gate structure GS1 may include the first high-k dielectric layer 51A and the first metal gate 53A, and the second gate structure GS2 may include the second high-k dielectric layer 51B and the second metal gate 53B. The first metal gate 53A is disposed on the first high-k dielectric layer 51A, and the second metal gate 53B is disposed on the second high-k dielectric layer 51B. In a cross-sectional view of the semiconductor device 100 (such as FIG. 8), the first high-k dielectric layer 51A may include a U-shaped structure surrounding the first metal gate 53A, and the second high-k dielectric layer 51B may include a U-shaped structure surrounding the second metal gate 53B. The oxide dielectric layer 21 disposed between the first gate structure GS1 and the semiconductor substrate 10 may directly contact the first high-k dielectric layer 51A, and the nitride dielectric layer 22 may be disposed between the second high-k dielectric layer 51B and the oxide dielectric layer 21 located on the I/O region R2. Additionally, the semiconductor device may further include the spacer 31 and the oxidation layer 40. The spacer 31 is disposed on the sidewall of the first gate structure GS1, the sidewall of the second gate structure GS2, a sidewall of the oxide dielectric layer 21, and a sidewall of the nitride dielectric layer 22. The oxidation layer 40 may be partly disposed between the spacer 31 and the first gate structure GS1 and partly disposed between the spacer 31 and the second gate structure GS2.

To summarize the above descriptions, in the semiconductor device and the manufacturing method thereof according to the present invention, the stacked structures including the patterned oxide layer and the patterned nitride layer are formed on the core region and the I/O region, and the patterned nitride layer on the core region is removed after the step of removing the dummy gates and before the step of forming the gate structures for forming the thinner dielectric layer on the core region. By the manufacturing method of the present invention, it is not necessary to remove the oxide dielectric layer on the core region, and the damage to other oxide portion, such as the oxidation layer and the interlayer dielectric, by the etching process for removing the oxide dielectric layer may be avoided. The condition of controlling the critical dimension (CD) of the gate structure on the core region and the height of the interlayer dielectric may be improved. The manufacturing yield may be enhanced and the electric performance of the semiconductor device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   providing a semiconductor substrate comprising a core region and an input/output (I/O) region defined thereon;
   forming a first stacked structure on the core region, wherein the first stacked structure comprises:
   a first patterned oxide layer;
   a first patterned nitride layer formed on the first patterned oxide layer; and
   a first dummy gate formed on the first patterned nitride layer;
   forming a second stacked structure on the I/O region, wherein the second stacked structure comprises:
   a second patterned oxide layer;
   a second patterned nitride layer formed on the second patterned oxide layer; and
   a second dummy gate formed on the second patterned nitride layer;
   removing the first dummy gate and the second dummy gate for forming a first recess above the core region and a second recess above the I/O region;
   forming a spacer on a sidewall of the first stacked structure and a sidewall of the second stacked structure before the step of removing the first dummy gate and the second dummy gate, wherein the first recess and the second recess are surrounded by the spacer, an oxidation layer is formed on a surface of the spacer by the step of removing the first dummy gate and the second dummy gate, and the first recess and the second recess are surrounded by the oxidation layer;
forming a first gate structure in the first recess;
forming a second gate structure in the second recess; and
removing the first patterned nitride layer before the step of forming the first gate structure in the first recess.

2. The manufacturing method of the semiconductor device according to claim 1, wherein the first patterned oxide layer and the second patterned oxide layer are formed by the same process patterning an oxide dielectric layer.

3. The manufacturing method of the semiconductor device according to claim 1, wherein the first patterned nitride layer and the second patterned nitride layer are formed by the same process patterning a nitride dielectric layer.

4. The manufacturing method of the semiconductor device according to claim 1, wherein the oxidation layer is formed before the step of removing the first patterned nitride layer.

5. The manufacturing method of the semiconductor device according to claim 1, wherein the first gate structure comprises:
   a first high dielectric constant (high-k) dielectric layer; and
   a first metal gate formed on the first high-k dielectric layer, wherein the first high-k dielectric layer comprises a U-shaped structure surrounding the first metal gate.

6. The manufacturing method of the semiconductor device according to claim 5, wherein the first patterned oxide layer directly contacts the first high-k dielectric layer.

7. The manufacturing method of the semiconductor device according to claim 1, wherein the second gate structure comprises:
   a second high-k dielectric layer; and
   a second metal gate formed on the second high-k dielectric layer, wherein the second high-k dielectric layer comprises a U-shaped structure surrounding the second metal gate.

8. The manufacturing method of the semiconductor device according to claim 7, wherein the second nitride layer is located between the second high-k dielectric layer and the second patterned oxide layer.

9. A semiconductor device comprising:
   a semiconductor substrate comprising a core region and an input/output (I/O) region defined thereon;
   a first gate structure disposed on the core region, wherein the first gate structure comprises:
      a first high dielectric constant (high-k) dielectric layer; and
      a first metal gate disposed on the first high-k dielectric layer, wherein the first high-k dielectric layer comprises a U-shaped structure surrounding the first metal gate in a cross-sectional view of the semiconductor device;
   a second gate structure disposed on the I/O region, wherein the second gate structure comprises:
      a second high-k dielectric layer; and
      a second metal gate disposed on the second high-k dielectric layer, wherein the second high-k dielectric layer comprises a U-shaped structure surrounding the second metal gate in a cross-sectional view of the semiconductor device;
   an oxide dielectric layer party disposed between the first gate structure and the semiconductor substrate and partly disposed between the second gate structure and the semiconductor substrate, wherein the oxide dielectric layer disposed between the first gate structure and the semiconductor substrate directly contacts the first high-k dielectric layer; and
   a nitride dielectric layer disposed between the second gate structure and the oxide dielectric layer, wherein the nitride dielectric layer is disposed between the second high-k dielectric layer and the oxide dielectric layer, and the nitride dielectric layer directly contacts the second high-k dielectric layer.

10. The semiconductor device according to claim 9, further comprising:
   a spacer disposed on a sidewall of the first gate structure, a sidewall of the second gate structure, a sidewall of the oxide dielectric layer, and a sidewall of the nitride dielectric layer.

11. The semiconductor device according to claim 10, further comprising:
   an oxidation layer partly disposed between the spacer and the first gate structure and partly disposed between the spacer and the second gate structure.

12. The semiconductor device according to claim 9, wherein the nitride dielectric layer is thicker than the oxide dielectric layer.

* * * * *